United States Patent [19]

Masuda

[11] 4,125,821

[45] Nov. 14, 1978

[54] POTENTIOMETER PROVIDING A NON-LINEAR OUTPUT

[75] Inventor: Noboru Masuda, Tokyo, Japan

[73] Assignee: Denki Onkyo Company, Limited, Japan

[21] Appl. No.: 822,331

[22] Filed: Aug. 5, 1977

[51] Int. Cl.² .............................................. H01L 43/08
[52] U.S. Cl. ................................ 338/32 R; 323/94 H; 324/251
[58] Field of Search ...................... 338/32 R, 32 H, 12; 335/205, 207, 215; 324/251, 252, 208, 207; 323/94 H

[56] References Cited

U.S. PATENT DOCUMENTS

| 3,331,045 | 7/1967 | Weiss et al. ........................ 338/32 R |
| 3,745,503 | 7/1973 | Kobayashi ............................ 338/12 |
| 3,777,273 | 12/1973 | Baba et al. ......................... 324/208 X |

*Primary Examiner*—C. L. Albritton
*Attorney, Agent, or Firm*—Robert E. Burns; Emmanuel J. Lobato; Bruce L. Adams

[57] ABSTRACT

A potentiometer which is generally similar to those potentiometers incorporating a pair of magnetic resistance effect elements and providing a linear output, but which produces a non-linear output by the choice of a particular configuration for the sensor surface of the elements and their relative arrangement. In accordance with the invention, a pair of magnetic resistance effect elements having sensor surfaces which are identical in configuration and size are mounted on the mount and are alternately exposed to the effective magnetic field as the latter rotates about the center of rotation during the rotation of the shaft. The sensor surfaces of the elements are disposed such that when a first and a second coordinate axis, orthogonal to each other, are drawn on the mount passing through the center of rotation, they are located on the opposite sides of the first coordinate axis and spaced from each other symmetrically with respect to the center of rotation. A scan begins with one end of the wiper edge of the effective magnetic field and ends with the other end thereof. During the scan, the area of the element exposed to the effective magnetic field varies non-linearly as the shaft rotates. The scan by the effective magnetic field takes place in a complementary manner for the pair of elements. As the area of the individual element exposed to the effective magnetic field varies, the resistance presented by the element varies in proportion thereto.

12 Claims, 15 Drawing Figures

POTENTIOMETER PROVIDING A NON-LINEAR OUTPUT

FIELD AND BACKGROUND OF THE INVENTION

The invention relates to an apparatus for producing an electrical signal having a voltage value which varies with an angle of rotation, and more particularly, to a potentiometer having a pair of semiconductor magnetic resistance effect elements which cooperate with a permanent magnet mounted on a rotatable shaft.

The conversion of a rotary motion into a translational motion by way of a potentiometer interposed between the both motional systems to derive an electrical output which varies as a function of a change in the rotational motion system and which is utilized to control an electrical drive to the translational motion system is extensively employed in many industrial fields, for example, numerically controlled machine tools, automobiles, electronically controlled sewing machines and the like. A potentiometer of this kind is fully described, for example, in U.S. Pat. No. 3,745,503 which is assigned to the same assignee as the present invention. A potentiometer of the prior art provides an output which is a linear function of the angle of rotation. Specifically, a semi-circular magnetic field is established for angular movement together with a rotary shaft about the axis of the latter, thus scanning a pair of magnetic resistance effect semiconductor elements each having an arcuate sensor surface and disposed annularly about the axis. The annular sensor surfaces of the pair of elements form together a circular band of a uniform width, so that a change in the area of the sensor surfaces of the elements exposed to the magnetic field varies in proportion to the variation in the angle of rotation, thereby causing a proportional change in the resistance of the elements. The pair of elements are connected in series across a d.c. source, and hence the potential at the junction between the elements also varies in a proportional manner.

Generally, it is considered desirable to have a linear function output from a potentiometer to produce a proportional translational motion in response to a rotary motion. When such a potentiometer is used, distortions in the conversion response may be caused by mechanical errors of the translational motion system and tracking lag and often must be compensated for by the use of a potentiometer which produces a non-linear function output. On the other hand, a potentiometer having a predetermined non-linear function output is demanded recently in complicated machines utilizing an electronic control in order to achieve a non-linear relationship between the rotary motion and the translational motion. The prior art failed to meet such requirement.

SUMMARY OF THE INVENTION

It is an object of the invention to provide an apparatus which produces an electrical signal of a voltage level which varies in a non-linear manner as a function of the angle of rotation.

It is a specific object of the invention to provide a potentiometer including a pair of magnetic resistance effect elements cooperating with a permanent magnet mounted on a rotary shaft and disposed such that their active surface area exposed to the magnetic field of the magnet varies in a non-linear form with respect to the angle of rotation of the shaft.

In accordance with the invention, there is provided a potentiometer which is generally similar to those potentiometers incorporating a pair of magnetic resistance effect elements and providing a linear output, but which produces a non-linear output by the choice of a particular configuration for the sensor surface of the elements and their relative arrangement.

The potentiometer of the invention includes a rotary shaft adapted to be connected with a system experiencing a rotary motion for angular movement therewith. The rotary shaft is supported by means of a bearing mounted on a casing and its free end located within the casing. A permanent magnet of semi-cylindrical form is carried by the free end of the shaft and has an axis which is aligned with the axis of the latter. The magnet may be in the form of a square pillar, but a semi-cylindrical magnet is chosen in the description to follow. The magnet is axially magnetized and has one pole face which lies in a plane perpendicular to the axis. The pole face is opposed, with a small clearance, by a mount of magnetizable material which is parallel thereto, thus forming a magnetic field therebetween. The flux density across the path is substantially uniform over a region defined by the axis projection of the pole face onto the mount. For this reason, this region will be referred to hereafter as "effective magnetic field", it being understood that the flux density is uniform in this region. In this connection, the rectilinear boundary of the semi-circular effective magnetic field will be referred to as "wiper edge" and the center thereof which is in alignment with the axis of the shaft as "center of rotation".

In accordance with the invention, a pair of magnetic resistance effect elements having sensor surfaces which are identical in configuration and size are mounted on the mount and are alternately exposed to the effective magnetic field as the latter rotates about the center of rotation during the rotation of the shaft. The sensor surfaces of the elements are disposed such that when a first and a second coordinate axis, orthogonal to each other, are drawn on the mount passing through the center of rotation, they are located on the opposite sides of the first coordinate axis and spaced from each other symmetrically with respect to the center of rotation. A scan begins with one end of the wiper edge of the effective magnetic field and ends with the other end thereof. During the scan, the area of the element exposed to the effective magnetic field varies non-linearly as the shaft rotates. The scan by the effective magnetic field takes place in a complementary manner for the pair of elements. As the area of the individual element exposed to the effective magnetic field varies, the resistance presented by the element varies in proportion thereto. The pair of elements is connected in series across a d.c. source. Output terminals are connected with the junction between the negative terminal of the source and one of the elements and with the junction between the both elements. In this manner, a voltage signal is developed across the output terminals which varies in a non-linear manner with a change in the angle of rotation. A reference voltage is developed when the wiper edge of the effective magnetic field aligns with the second coordinate axis, and either maximum or minimum voltage is obtained when the wiper edge is aligned with the first coordinate axis.

DESCRIPTION OF PREFERRED EMBODIMENTS

Figure 1:
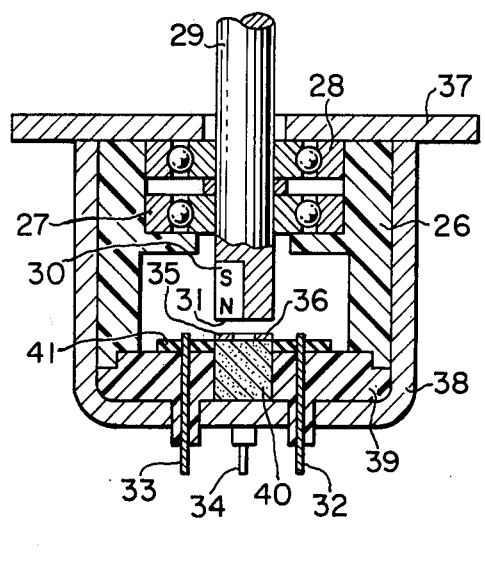
FIG. 1 is a cross section view of a potentiometer with a pair of magnetic resistance effect elements according to the invention.

Referring to FIG. 1, there is shown a bearing holder 26 which is formed of a plastic material and cylindrical in configuration having an increased wall thickness. A pair of bearings 27, 28 are mounted within the holder 26 for rotatably supporting a rotary shaft 29, formed of a non-magnetic material such as aluminium. The shaft has its one end connected with a system undergoing a rotary motion, and its other end has adhesively secured thereto, as with epoxy resin, a permanent magnet 30 of solid semi-cylindrical form which is axially magnetized as shown to present N- and S-poles at its opposite ends. The flat side of the magnet is aligned with the axis of the shaft 29, and its pole face 31 is flush with the lower end face of the shaft 29. A baseplate 39 of a plastic material is secured to the bottom of the bearing holder 26 as by adhesive or set screws. The baseplate 39 is centrally embedded with a solid cylindrical magnetic piece or mount 40, which is partly exposed. The mount 40 may be positioned within the baseplate by forming an opening in the latter or by molding the latter about the mount. Also embedded into and extending through the baseplate 39 are terminal pins 32, 33, 34, the upper exposed end of which is connected with a printed circuit board 41 that is placed on top of the baseplate 39.

A pair of magnetic resistance effect elements 35, 36 are adhesively secured to the upper surface of the mount 40, and have their lead wires electrically connected with a printed circuit on the board 41. In the conventional potentiometer providing a linear output, the pair of elements corresponding to those shown at 35, 36 would be disposed annularly so that their sensor surfaces form a circular band. However, in accordance with the invention, the elements 35, 36 having an identical configuration are spaced from each other and located in a manner to be described more fully later. A plate 37 formed of pure iron is secured to the bearing holder 26 by set screws, not shown, and a casing 38 of a magnetizable material which is cylindrical in configuration and having a bottom has its upper open end attached to the plate 37, the casing 38 enclosing the holder 26 and the baseplate 39. The other end of the terminal pins 32 to 34 extends through the casing bottom in insulated manner for connection with an external circuit. Thus the plate 37 and the casing 38 have the dual function of an electromagnetic shield and a magnetic return path for the magnet 30. With the arrangement described above, as the shaft 29 moves angularly or rotates, the field of the magnet 30 acts alternately upon the elements 35, 36, whereby their resistance varies in accordance with the rotation of the shaft 29.

Figure 2:
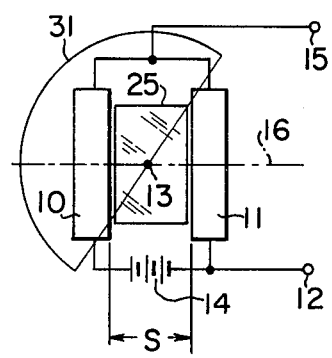
FIGS. 2, 4, 6, 8, 9 and 11 are plan views of several forms of the potentiometer according to the invention, illustrating various configurations and/or arrangement of the pair of magnetic resistance effect elements.

FIG. 2 shows the configuration and lay-out of the sensor surfaces 10, 11 of the elements 35, 36 together with the form of the pole face 31 of the magnet 30 in the potentiometer of the invention. The elements 35, 36 have their flux sensitive surfaces 10, 11 formed in an identical configuration and size so as to exhibit an equal output response. At this instance, no practical detriment is caused to the use of the potentiometer if an arrangement is made so that the difference between the values of initial resistance of a pair of the elements when not applied with the flux is kept within ± 1% and the rate of variation in the resistance when applied with flux, i.e. the difference between the values of resistance in the respective elements is kept within 5% at 5 k gauss, and further the temperature coefficients of the respective elements are equal. Specifically, the elements are in the form of an elongate strip. Where the individual elements are too small to be applied separated to the mount 40, they may be simultaneously formed on a suitable substrate by using evaporation or etching process in combination with a known photoresist technique. On the other hand, if the elements are large enough to allow them to be manually applied to the mount 40 individually, a spacer 25 of a non-magnetic material such as glass, for example, is interposed to provide a reference for the separation between the elements. In this instance, the elements are positioned by placing them in abuttment against the spacer. The flux sensitive surfaces 10, 11 of the pair of elements are disposed symmetrically with respect to the center of rotation 13 and are separated from each other by a distance S. One electrode of each element is connected with the opposite terminals of a d.c. source 14, while the other electrode is connected with a common output terminal 15.

Figure 3:
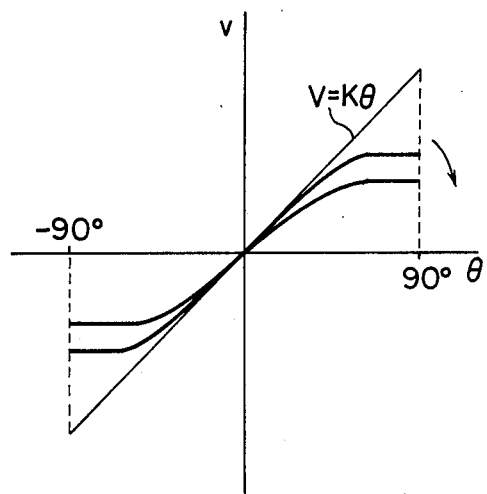
FIGS. 3, 5, 7, 10 and 12 are graphs graphically illustrating the output voltage versus angle of rotation of the potentiometers shown in FIGS. 2, 4, 6, 9 and 11, respectively.

With the arrangement described above, when the shaft 29 is turned to move the effective magnetic field 31 angularly from a position shown in dotted lines (this position corresponding to the origin of the ordinates shown in FIG. 3), the wiper edge 31a moves across the sensor surfaces 10, 11 to vary the resistance of the elements 35, 36. Thus the voltage V developed across the output terminal 15 and the ground terminal of the source 14 varies non-linearly, much in the manner of a sinusoidal function, rather than following a linear function $V = K\theta$, where $\theta$ represents an angle of rotation. The deviation from the linear function increases with an increase in the distance S, as indicated by an arrow.

Figure 4:
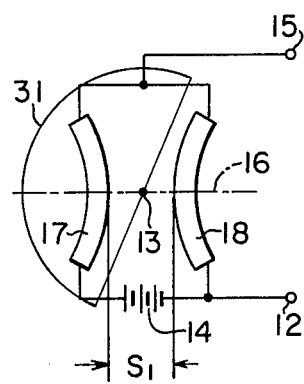
Figure 5:
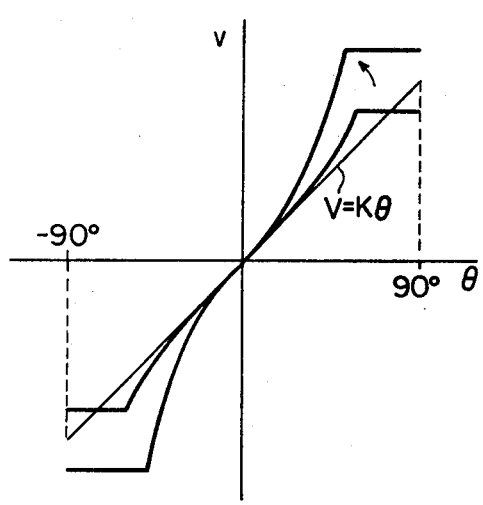

FIG. 4 shows another example of the configuration and lay-out of the flux sensitive surfaces of the elements 35, 36. In this instance, flux sensitive surfaces 17, 18 are of an identical arcuate form, but are disposed in back-to-back relationship. Again the elements are disposed symmetrically to the center 13 and separated from each other by a distance $S_1$. The resulting voltage is graphically shown in FIG. 5, with the non-linearity increasing with a decrease in the distance $S_1$ as suggested by an arrow.

Figure 7:
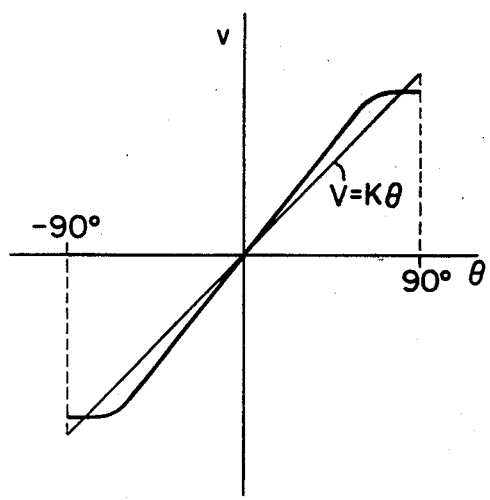
Figure 6:
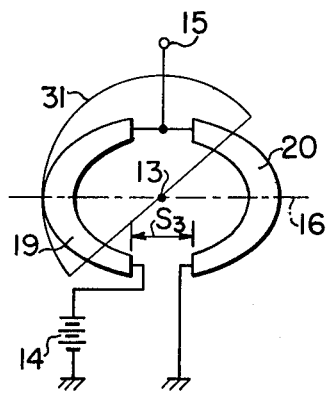
Figure 8:
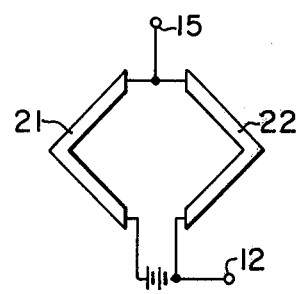

FIG. 6 shows a further embodiment in which the elements have strongly curved arcuate or horseshoe flux sensitive surfaces 19, 20 having their chords placed nearer each other. Again the elements are symmetrical to the center of rotation 13 and are separated from each other by a distance $S_3$. The flux sensitive surfaces 19, 20 are configured so as not to form a circle concentric with the circular locus of the magnet 30, but to be strongly curved into the latter. The resulting output response is shown in FIG. 7 and is characterized by a sharp initial rise. A similar result is also obtained with the arrangement shown in FIG. 8 in which flux sensitive surfaces 21, 22 are both V-shaped having limbs which are at right angles to each other.

The described embodiments employ elements having their flux sensitive surfaces of identical form and which are symmetrical to the center of rotation 13 so that the output responses in the first and third quadrants are symmetrical with respect to the origin of the coordinates. However, in accordance with the invention, it is also possible to form a potentiometer which provides non-symmetrical output responses in the first and third quadrants.

Figure 9:
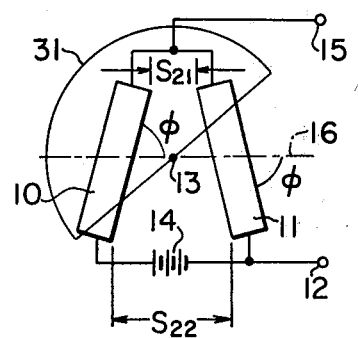
Figure 10:
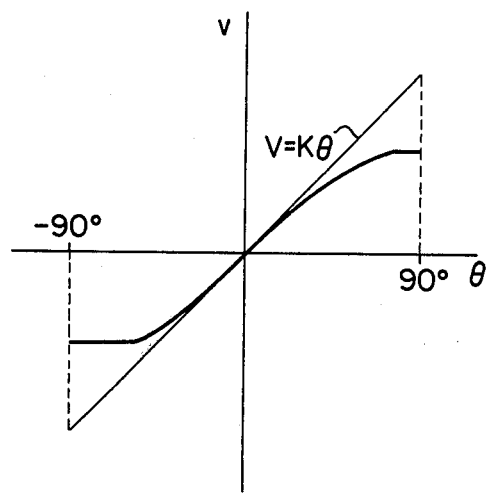

FIG. 9 shows an embodiment employing elements with flux sensitive surfaces 10, 11 which are similar in configuration to those shown in FIG. 2. However, the elements are disposed symmetrically with respect to a perpendicular to a phantom line 16. At one end nearer the output terminal 15, the elements are spaced by a distance $S_{21}$ while they are spaced by a distance $S_{22}$ ($S_{21} < S_{22}$) at the other end. The elements form an angle $\phi$ with the phantom line 16 ($\phi$ being less than 90°). With this arrangement, when the effective magnetic field 31 is angularly moved from a position aligned with the phantom line, the output responses in the first and third quadrants are not symmetrical with respect to the origin of the coordinates, as is shown in FIG. 10, and their shape varies with the angle $\phi$.

Figure 11:
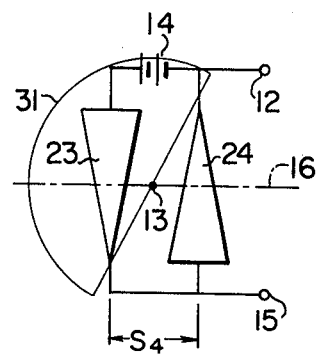
Figure 12:
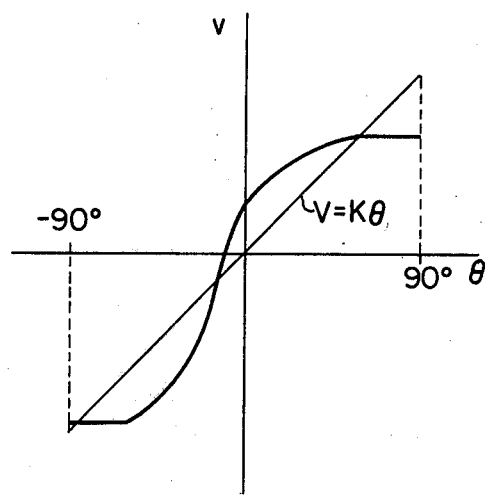

FIG. 11 shows yet another embodiment in which magnetic resistance effect elements having flux sensitive surfaces 23, 24 of a wedge form or an isosceles triangular form are disposed symmetrically with respect to the center of rotation 13 with a separation $S_4$ between the centerlines of the surfaces 23, 24. When the wiper edge is moved from a position aligned with the phantom line 16, the output varies as shown in FIG. 12, producing a finite value at $\theta = 0°$.

Figure 13:
FIG. 13 is a plan view of another form of the pole face of the permanent magnet.

FIG. 13 shows a rectangular pole face or effective magnetic field which may be substituted for the semicircular pole face 31. This can be implemented by mounting a magnet in the form of a square pillar on the shaft so that one of the longer sides serves as a wiper edge 46 and the center thereof is aligned with the center of rotation 47. An advantage is gained that a square piller magnet is easier to manufacture.

Figure 14A:
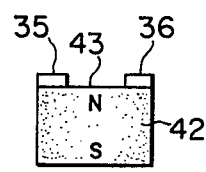
FIGS. 14a and 14b are side views of a mount which is slightly different from that shown in FIG. 1.
Figure 14B:
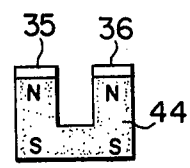

FIGS. 14a and 14b show mounts for the elements 35, 36 which are formed of a permanent magnet material. In FIG. 14a, a magnet mount 42 is of a solid cylindrical form and has one pole face 43 serving as an end face to which the elements 35, 36 are adhesively secured with a spacing between them. In FIG. 14b, a magnet mount 44 is U-shaped having a pair of limbs which present pole faces of same polarity and to which the elements are applied. The use of these magnet mounts 42, 44 affords the advantage that the boundary of the effective magnetic field is well defined. The magnet 30 and the magnets 42, 44 may be disposed so that poles of either similar or dissimilar polarities opposes to each other.

What is claimed is:

1. A potentiometer providing a non-linear output, comprising a rotary shaft of a non-magnetic material, a casing including a bearing means which support the rotary shaft for angular movement, the casing enclosing the free end of the shaft in spaced relationship therefrom, a permanent magnet carried by a free end of the rotary shaft and axially magnetized to present a pole face aligned with a plane perpendicular to the shaft, a mount of a magnetizable material disposed within the casing in parallel opposed relationship with the pole face of the permanent magnet with a small clearance therebetween whereby a magnetic field is established between the pole face and the mount, a pair of magnetic resistance effect semiconductor elements mounted on the mount and separated from each other, the elements each having a sensor surface, the sensor surfaces of the elements being located on the opposite sides of an imaginary line lying in a plane perpendicular to the axis of the shaft and disposed symmetrically with each other with respect to the imaginary line or a point of intersection between the line and the axis, each of the sensor surfaces being shaped such that an area thereof exposed to a magnetic flux from the pole face varies in a non-linear manner with an angle of rotation of the shaft, and circuit means for connecting the pair of elements in series across a d.c. source to derive an output from the junction between the elements.

2. A potentiometer according to claim 1 in which the sensor surfaces are in the form of narrow strips with their longer sides disposed parallel to each other on the opposite sides of the imaginary line.

3. A potentiometer according to claim 1 in which the sensor surfaces are arcuate in form and are disposed in back-to-back relationship on the opposite sides of the imaginary line.

4. A potentiometer according to claim 1 in which the sensor surfaces are arcuate in form and are disposed to present their concave sides opposite to each other on the opposite sides of the imaginary line.

5. A potentiometer according to claim 1 in which the sensor surfaces are in the form of narrow strips with their longer sides disposed on the opposite sides of the imaginary line so as to form an angle with the latter.

6. A potentiometer according to claim 1 in which the sensor surfaces are each in the form of an isosceles triangle with their altitude disposed parallel to each other on the opposite sides of the imaginary line.

7. A potentiometer according to claim 1 in which the permanent magnet has a wiper edge which passes through the axis of the shaft.

8. A potentiometer according to claim 7 in which the pole face of the magnet is of a semi-circular form having its chord serving as the wiper edge.

9. A potentiometer according to claim 7 in which the pole face of the magnet is rectangular in configuration with its one side serving as the wiper edge.

10. A potentiometer according to claim 1 in which the mount being formed of a permanent magnet material and has one pole face which lies in a plane perpendicular to the axis of the shaft, the pair of elements being mounted on the pole face.

11. A potentiometer according to claim 1 in which the mount is U-shaped in section and has a pair of limbs, the mount being formed of a permanent magnet material magnetized lengthwise of the limbs to the same polarity in both limbs, the pair of elements being mounted on the end of the respective limbs.

12. A potentiometer according to claim 1 in which the pair of elements are positioned by a spacer of a non-magnetic material on the mount.

* * * * *